United States Patent [19]

Miyatake

[11] Patent Number: 5,020,031
[45] Date of Patent: May 28, 1991

[54] DYNAMIC SEMICONDUCTOR MEMORY DEVICE HAVING IMPROVED VOLTAGE READ-OUT

[75] Inventor: Hideshi Miyatake, Hyogo, Japan

[73] Assignee: Mitsubishi Denki Kabushiki Kaisha, Tokyo, Japan

[21] Appl. No.: 444,218

[22] Filed: Dec. 1, 1989

[30] Foreign Application Priority Data

Dec. 5, 1988 [JP] Japan ................................ 63-308186

[51] Int. Cl.⁵ ..................... G11C 13/00; G11C 11/40
[52] U.S. Cl. .................................... 365/203; 365/205
[58] Field of Search ................... 365/203, 205, 189.05, 365/230.06

[56] References Cited

U.S. PATENT DOCUMENTS

4,953,129 8/1990 Kobayashi et al. ................. 365/203

Primary Examiner—Terrell W. Fears
Attorney, Agent, or Firm—Lowe, Price, LeBlanc, Becker & Shur

[57] ABSTRACT

P-type sense amplifier and N-type sense amplifier are connected to each of bit lines in a pair of bit lines respectively. N-channel MOS transistor is connected to each of the bit lines between the P-type sense amplifier and the N-type sense amplifier, and normally turned on. Each of a plurality of memory cells is connected to any of the bit lines at the side of the N-type sense amplifier from the transistor. The power source potential generated by the P-type sense amplifier is dropped by the threshold voltage of the transistor and supplied to one of the bit liens to which the memory cells are connected. The ground potential generated by the N-type sense amplifier is supplied without changing the potential to other of the bit lines. If the threshold value of the transistors to constitute the memory cells is made equal to the threshold voltage of the transistors on the bit lines, intermediate potential between the potential as "H" level held in the memory cells and the potential as "L" level becomes equal to the precharge potential of the bit lines, thereby unbalance of the read-out voltages can be eliminated.

17 Claims, 9 Drawing Sheets

DYNAMIC SEMICONDUCTOR MEMORY DEVICE HAVING IMPROVED VOLTAGE READ-OUT

BACKGROUND OF THE INVENTION

1. Field of the Invention

The present invention relates to semiconductor memory devices, and more particularly to improvement of bit line precharge voltage in a dynamic semiconductor memory device.

2. Description of the Related Art

Figure 4:
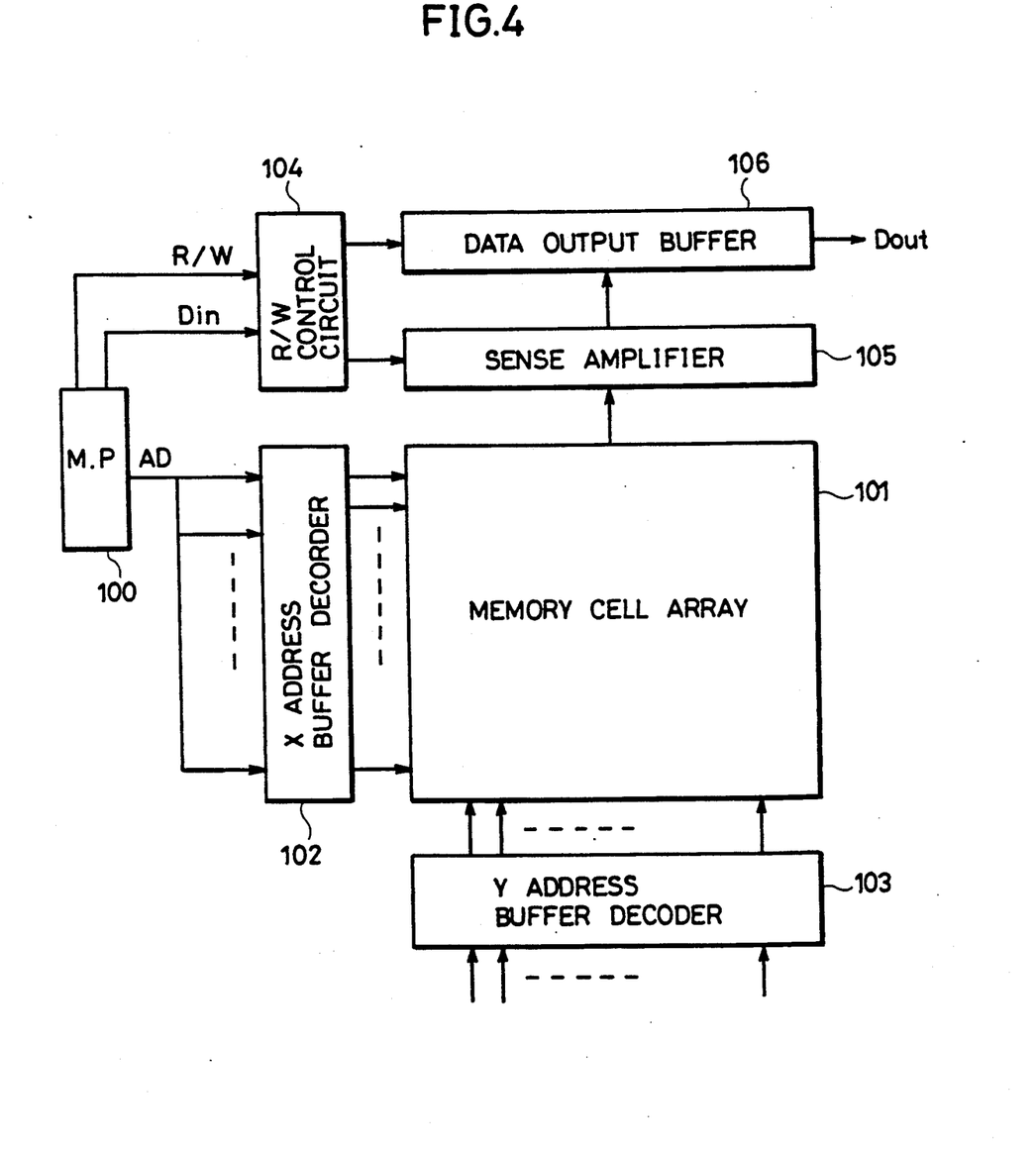
FIG. 4 is a block diagram illustrating a DRAM in general.

FIG. 4 is a block diagram illustrating an example of constitution of a dynamic semiconductor memory device (hereinafter referred to as "DRAM") in the prior art. Referring to FIG. 4, in a memory cell array 101, a plurality of word lines (not shown) and a plurality of bit lines (not shown) are arranged so as to intersect to each other, and a memory cell (not shown) is installed to each intersection point between these word lines and bit lines. In accordance with address signals AD from a microprocessor 100, selection of the memory cell is performed in every intersection point between one word line selected by an X address buffer decoder 102 and one bit line selected by a Y address buffer decoder 103. Data is written in the selected memory cell or data held in the memory cell is read out, and command of write/read of the data is performed by read/write control signal (R/W) supplied to an R/W control circuit 104 from the microprocessor 100. During the data write state, input data (Din) is input to the memory cell selected through the R/W control circuit 104. On the other hand, during the data read state, data held in the selected memory cell is detected and then amplified by a sense amplifier 105, and outputted as output data (Dout) through a data output buffer 106 to the outside.

Figure 5:
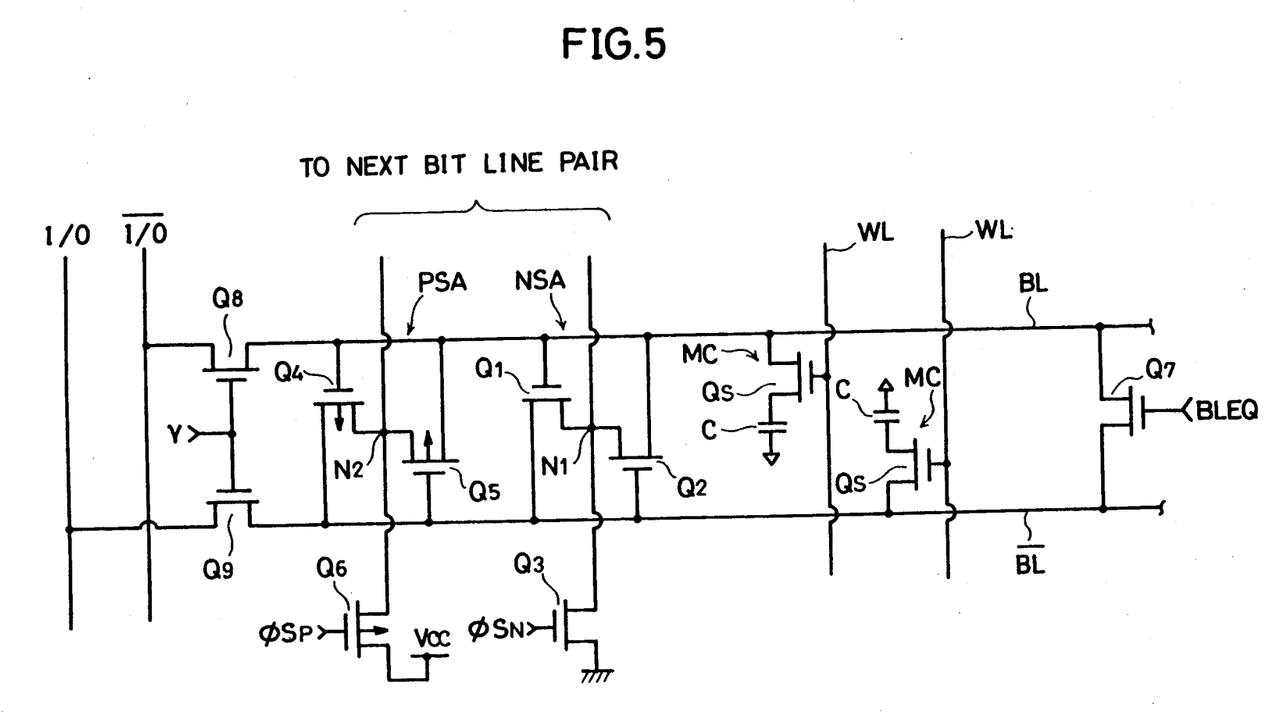
FIG. 5 is a circuit diagram illustrating a pair of bit lines in the prior art.

FIG. 5 shows a portion of a set of bit line pairs in a dynamic semiconductor memory device in the prior art, for example, disclosed in "A 288K CMOS Pseudostatic RAM" IEEE Journal of Solid-State Circuits, Vol. SC-19, No. 5, pp. 619–623, October 1984.

In FIG. 5, a plurality of word lines WL are arranged so as to intersect bit line pair BL, $\overline{BL}$, and a memory cell MC is installed at an intersection point between each bit line BL or $\overline{BL}$ and each word line WL. In FIG. 5, only one memory cell MC connected to the bit line BL and one memory cell MC connected to the bit line $\overline{BL}$ are shown, and other memory cells are omitted. Each memory cell MC comprises a transfer transistor Qs and a storage capacitor C. The transistor Qs is connected between the bit line BL or $\overline{BL}$ and the storage capacitor C, and its gate is connected to the word line WL.

An N type sense amplifier NSA and a P type sense amplifier PSA are connected to the bit line pair BL, $\overline{BL}$. The N type sense amplifier NSA comprises N-channel MOS transistor Q1 and Q2. The transistor Q1 is connected between the bit line $\overline{BL}$ and a node N1, and its gate is connected to the bit line BL. The transistor Q2 is connected between the bit line BL and the node N1, and its gate is connected to the bit line $\overline{BL}$. The node N1 is connected through N-channel MOS transistor Q3 to the ground potential, and sense amplifier activating signal $\phi S_N$ is supplied to the gate of the transistor Q3. The P type sense amplifier PSA comprises P-channel MOS transistors Q4 and Q5. The transistor Q4 is connected between the bit line $\overline{BL}$ and a node N2, and its gate is connected to the bit line BL. The transistor Q5 is connected between the bit line BL and a node N2, and its gate is connected to the bit line $\overline{BL}$. The node N2 is connected through P-channel MOS transistor Q6 to the power source potential Vcc, and sense amplifier activating signal $\phi S_P$ is supplied to gate of the transistor Q6. Further, an equalizing N-channel MOS transistor Q7 is connected between the bit line pair BL, $\overline{BL}$, and its gate is supplied with equalizing signal BLEQ. Ends of the bit lines BL and $\overline{BL}$ are connected respectively through N-channel transistors Q8 and Q9 to input/output lines I/0, $\overline{I/0}$, and column selective signal Y is supplied to gate of the transistors Q8 and Q9.

Figure 6:
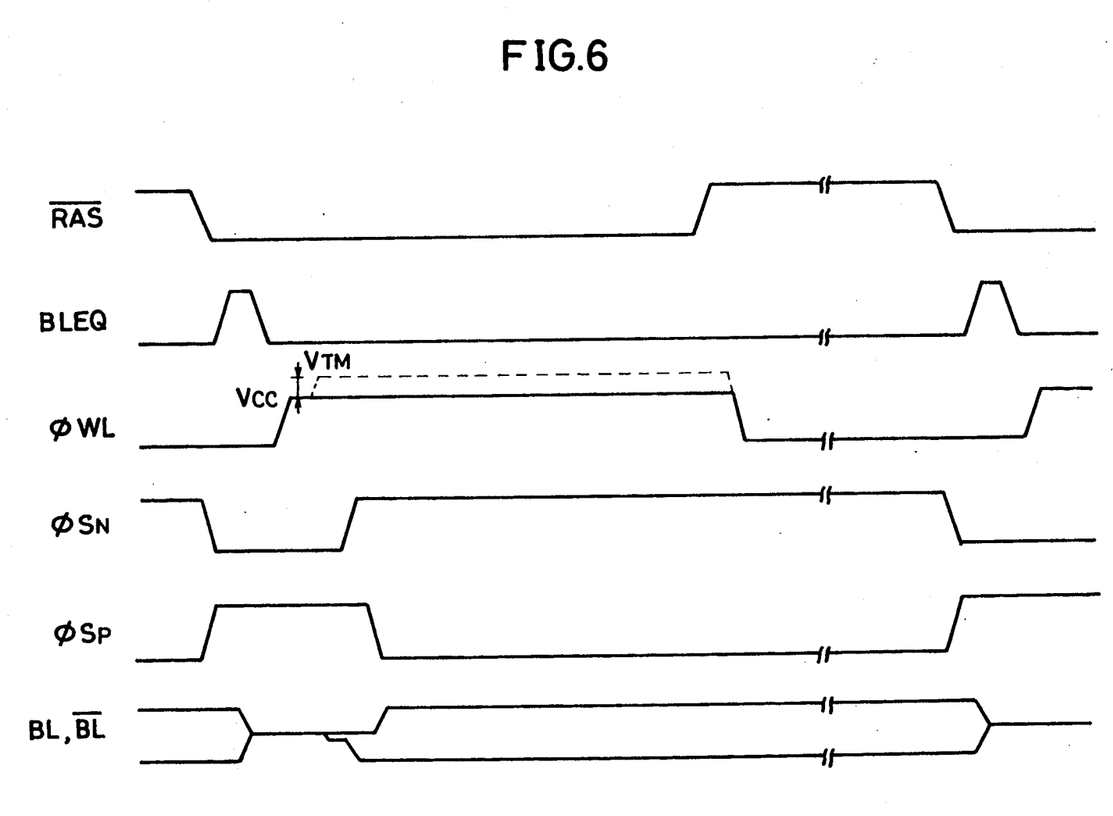
FIG. 6 is a waveform chart illustrating operation of FIG. 5.

Operation of the circuit in FIG. 5 will be described using an operation waveform chart in FIG. 6. When row address strobe signal $\overline{RAS}$ is at a logical high level or "H" level, i.e., in an off-time period, the sense amplifier activating signal $\phi S_N$ attains the "H" level and the sense amplifier activating signal $\phi S_P$ attains a logical low level or "L" level, and the sense amplifier NSA and PSA attain the active state. Thereby one potential of the bit line pair BL, $\overline{BL}$ is held to the "H" level, and other potential thereof is held to the "L" level. Next, when the row address strobe signal $\overline{RAS}$ is held at the "L" level, i.e., in an active period, first, the sense amplifier activating signal $\phi S_N$ is made the "L" level and the sense amplifier activating signal $\phi S_P$ is made the "H" level, thereby the sense amplifiers NSA and PSA are made nonactive state. And then the equalizing signal BLEQ is once made the "H" level, and the bit line pair BL, $\overline{BL}$ is shortcircuited therebetween. Thereby potential of the bit lines BL and $\overline{BL}$ becomes intermediate potential (precharge potential) between the "H" level and the "L" level. After the equalizing signal BLEQ is returned to the "L" level and the shortcircuit of the bit line pair is released, word line drive signals $\phi WL$ rises to the power source potential Vcc (shown by solid line in FIG. 6). Thereby information, i.e., charge on the memory cell MC with the gate of its transistor connected to the selected word line WL is read out to the corresponding bit line BL or $\overline{BL}$, and potential of the bit line BL or $\overline{BL}$ slightly rises or falls in accordance with the information of the memory cell MC. The potential of the bit line BL or $\overline{BL}$ not connected to the selected memory cell MC is still held to the precharge potential. Subsequently if the sense amplifier activating signal $\phi S_N$ is made the "H" level and the sense amplifier activating signal $\phi S_P$ is made the "L" level and the sense amplifiers NSA and PSA are made active, potential between the bit line BL and the bit line $\overline{BL}$ is amplified. As a result, between the bit line pair BL, $\overline{BL}$, one line having higher potential is fixed to the "H" level, and other line having lower potential is fixed to the "L" level. Subsequently if column selective signal Y goes to the "H" level, the transistors Q8 ad Q9 are turned on, and potential of the bit line pair BL, $\overline{BL}$ is read out at the input/output lines I/O, $\overline{I}$/ and the information is output. Subsequently if the row address strobe signal $\overline{RAS}$ rises to the "H" level, the active period ends and the word line drive signal WL falls to the "L" level. Thereby the transistor Qs of the memory cell MC with gate of its transistor connected to the selected word line WL is turned off. However, the sense amplifiers NSA and PSA are still held in the activated state before next active period begins. IF the row address strobe signal $\overline{RAS}$ becomes the "L" level and the active period begins, the above-mentioned operation is performed again.

Figure 7:
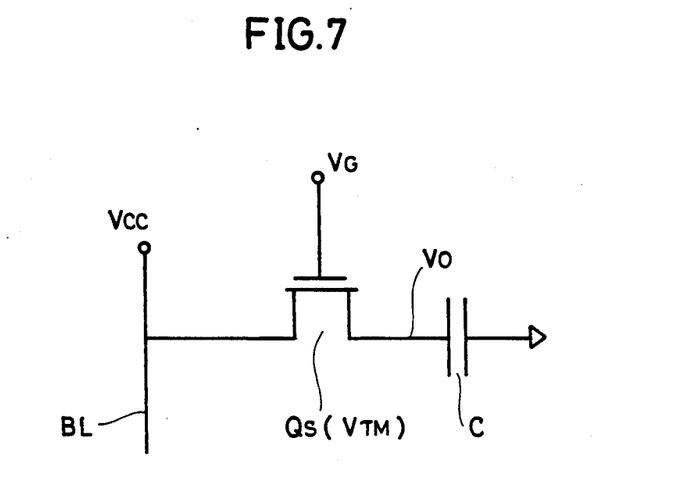
FIG. 7 is an equivalent circuit diagram of a memory cell in general.
Figure 8:
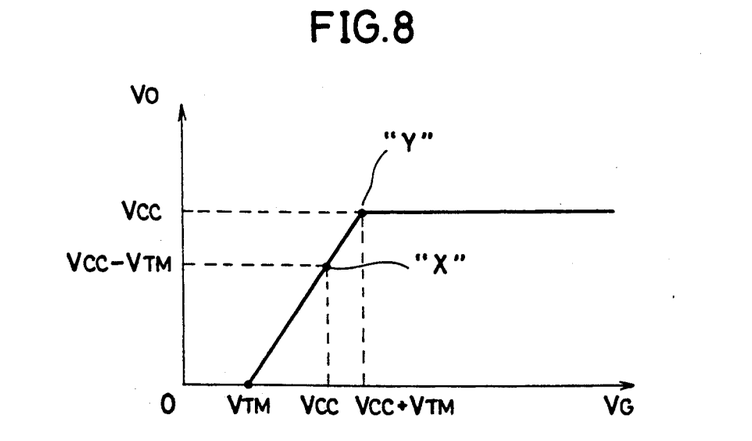
FIG. 8 is an operation characteristic diagram illustrating operation of a transistor of a memory cell in FIG. 7.
Figure 9:
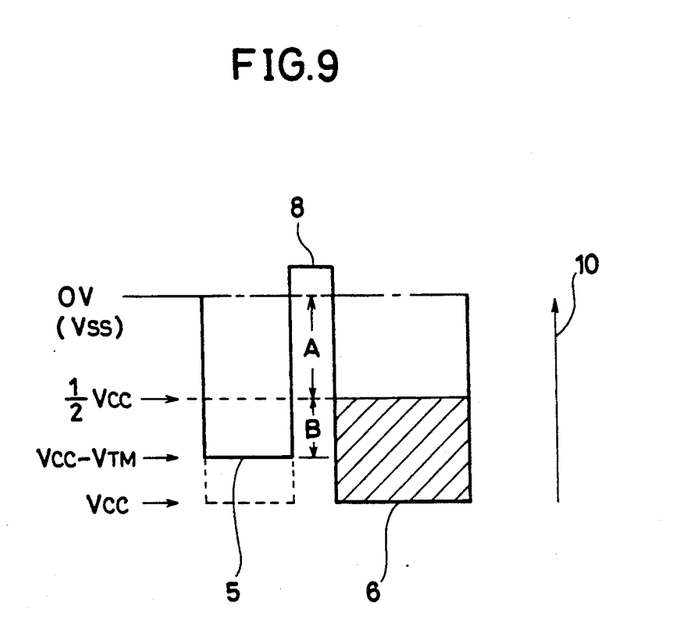
FIG. 9 is a diagram illustrating state of potential around a memory cell in non-boost word line system in the prior art.

FIG. 7 shows an equivalent circuit which takes out one of the memory cells shown in FIG. 5, and FIG. 8 shows characteristics of potential of the transistor of the memory cell explaining the potential holding operation of the memory cell in FIG. 9.

The operation characteristics will now be described referring to FIGS. 7 and 8.

Assume that potential applied to gate of the transistor Qs is $V_G$, potential of the bit line BL being at the "H" Level is the power source potential Vcc, and potential held in the capacitor C is Vo. The transistor Qs is N-channel MOS transistor, and its threshold voltage is made $V_{TM}$. In general, the gate potential $V_G$ attains to the power source potential Vcc at the "H" level state. In FIG. 8, the gate potential $V_G$ is taken on abscissa and the stored potential Vo of the capacitor C is taken on ordinate. In this case, the power source potential Vcc is made constant. First, the process will be described where the bit line BL is held to the power source potential Vcc, and selection of the word line, i.e., the gate potential $V_G$ rises to the power source potential Vcc. As shown in FIG. 8, when the gate potential $V_G$ becomes equal to the threshold voltage $V_{TM}$ of the transistor Qs, the transistor Qs begins to be turned on. Subsequently as the gate potential $V_G$ rises, the potential Vo held to the capacitor C also rises. When the gate potential $V_G$ reaches the power source potential Vcc, despite the potential Vcc of the bit line BL, the stored potential Vo of the capacitor C does not become the power source potential Vcc. That is, from characteristics of the N-channel transistor, the stored potential Vo at that time is Vcc$-V_{TM}$ (refer to point "X"). Consequently, when the power source potential Vcc is applied to the gate potential $V_G$, the stored potential Vo of the capacitor C becomes lower than the power source potential Vcc appearing at the bit line BL by the threshold value of the transistor Qs.

FIG. 9 is a diagram illustrating potential around the memory cell in the prior art.

In FIG. 9, electronic potential 10 is shown as 5 regarding a storage node and as 6 regarding a bit line of a memory cell separated by the word line shown as 8. When information in the memory cell, i.e., stored potential is readout at the bit line, potential of the bit line 6 is already precharged to ½ Vcc. If information of the "H" level is held in the memory cell then, as above described, the stored potential is not the power source potential Vcc but Vcc$-V_{TM}$. On the other hand, when the information charge held in the memory cell is at the "L" level, the potential held therein is 0V (Vss). Thus information at either the "H" level or the "L" level is held in the memory cell. In this case, taking the stored potentials at the "H" level and the "L" level as a basis, the precharge potential ½ Vcc of the bit line 6 is not in the intermediate position between these potential levels. That is, in FIG. 9, voltage A of difference between the potential held to the "L" level and the potential of ½ Vcc is ½ Vcc. On the contrary, voltage B of difference between the potential (Vcc$-V_{TM}$) held in the memory cell of the "H" level and the potential of ½ Vcc is ½ Vcc$-V_{TM}$. As a result, difference of the read-out voltages based on the precharge potential at the "H" level and the "L" level is not equal.

A system of this type wherein potential of the word line is raised to the power source potential Vcc is called a non-boost word line system.

In order to make difference of the read-out voltage equal as an improvement on the non-boost word line system as above described, a boost word line system has been employed in recent years. That is, as shown in broken line of FIG. 6, potential of the "H" level of the word line drive signal $\phi$WL is raised above the power source potential Vcc further by the threshold voltage $V_{TM}$ of the transistor Qs.

Figure 10:
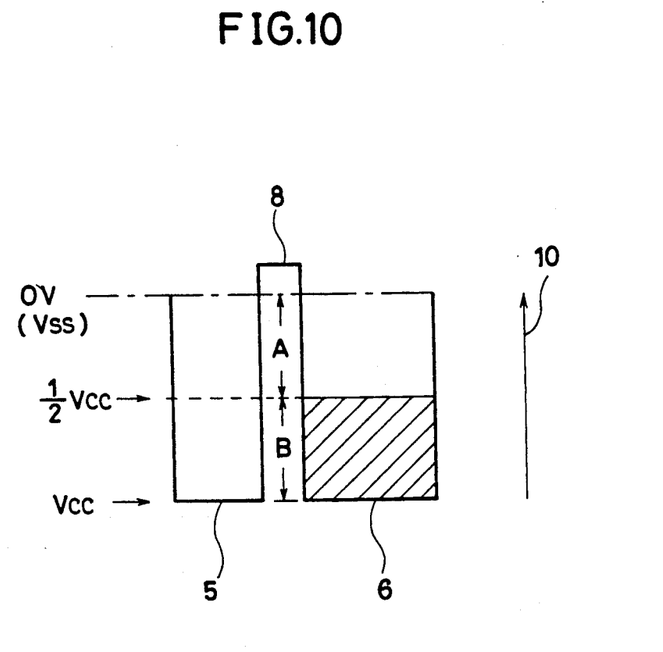
FIG. 10 is a diagram illustrating state of potential around a memory cell in boost word line system in the prior art.

FIG. 10 is a diagram illustrating potential around the memory cell in a boost word line system in the prior art.

In FIG. 10, the precharge potential ½ Vcc of the bit line 6 is similar to that of FIG. 9. However, if the gate potential $V_G$ of the transistor Qs in FIG. 6 is raised to Vcc$+V_{TM}$, since the power source voltage Vcc of the bit line BL is transmitted as it is, the holding potential Vo held in the capacitor C becomes Vcc (refer to point "Y"). In this case, as shown in FIG. 9, the stored potential at "H" level of the storage node 5 of the memory cell becomes Vcc, and decrease of the potential by the threshold voltage of the transistor Qs is not produced. Consequently, the precharge potential ½ Vcc is in the intermediate position between "H" level and "L" level of the holding potential, and the read-out voltages A and B based on the precharge potential becomes uniform. Thus the boost word line system is employed, thereby difference of the read-out voltages of the memory cell can be eliminated.

The boost word line system is disclosed in "Fully Boosted 64K Dynamic RAM with Automatic and Self-Refresh" M. Taniguchi et al, IEEE Journal of Solid-State Circuits, SC-16, 492, 1981.

However, the boost word line system presents new problem. That is, as the semiconductor memory devices in recent years are more and more highly integrated and the short-channel effect of transistors increasingly becomes significant, the boost word line system becomes difficult to be employed. More specifically, in order to prevent the short-channel effect such as the drop in threshold voltage, the drop in breakdown voltage between the source and the drain and degradation of characteristics of the transfer gate transistor caused by a hot carrier effect, the substrate density of the semiconductor substrate further increases, and therefore lack of voltage withstand capability at the junction portion of the circuit generating high voltage becomes significant. Consequently, a system to eliminate the difference data read-out voltages described above without employing the boost word line system is desired.

SUMMARY OF THE INVENTION

An object of the invention is to improve reliability of reading-out operation without boosting word line voltage in a semiconductor memory device of bit line precharge system.

Another object of the invention is to improve difference of read-out voltages based on information held in the memory cell without boosting word line voltage in a semiconductor memory device of bit line precharge system.

Still another object of the invention is to improve read-out margin of information held in the memory cell without boosting word line voltage in a semiconductor memory device of bit line precharge system.

In order to attain the foregoing objects, a semiconductor memory device according to the invention comprises a bit line pair, a plurality of memory cells, a first potential generating means, a second potential generating means, and a potential control means. The bit line pair comprises a first portion and a second portion. The plurality of memory cells are each connected to 9 bit line of the bit line pair at the first portion. The first potential generating means is connected to each of bit lines of the bit line pair at the second portion, and generates the first potential in response to potential of each of bit lines of each bit line pair at the second portion, and supplies the first potential to one bit line of the bit line pair at the second portion. The second potential generating means is connected to each of the bit lines of the bit line pair at the first portion or the second portion, and generates the second potential less than the first potential in response to the potential of each of bit lines at the first portion or the second portion, and supplies the second potential to the other bit line of the bit line pair at the first portion or the second portion. The potential control means is connected between each of bit lines of the bit line pair at the first portion and each of bit lines of the bit line pair at the second portion, and reduces the first potential supplied to one bit line pair at the second portion onto one bit line of the bit line pair at the first portion and transmits it.

In accordance with the preferred embodiment, a semiconductor memory device according to one aspect of the invention, in some aspect, comprises at least a pair of bit lines, at least two memory cells, a selective means, a reading-out means, a third potential generating means, a second potential generating means, a potential control means, a connecting means, and an equalizing means, wherein the selective means is activated in the state that each of bit lines is held to the intermediate potential by the equalizing means. At least two memory cells are connected to each of the bit lines, and holds the first potential or the second potential less than the first potential. The selective means selects any of the memory cells. The reading-out means, in response to the selective output of the selective means, reads out the first or second potential held in the selected memory cells onto the bit lines connected to the selected memory cell. The third potential generating means is connected to each of bit lines, and generates the third potential larger than the first potential in response to variation of potential of the bit line produced in response to potential read out by the reading-out means. The second potential generating means is connected to each of bit lines, and generates the second potential in response to variation of potential of the bit line produced in response potential read out by the reading-out means. The potential control means is connected between the third potential generating means and each of bit lines, and supplies one of bit lines with the third potential by the third potential generating means as fourth potential being less than the third potential and larger than the first potential. The connecting means is connected between the second potential generating means and each of bit lines, and supplies other bit line with the second potential by the second potential generating means. The equalizing means equalizes potentials of each of bit lines produced by the potential control means and the connecting means in to intermediate potential between these potentials.

In accordance with the more specific aspect of the invention, there are provided with a plurality of memory cells, a plurality of word lines, a plurality of bit line pairs, a plurality of first sense amplifiers. A plurality of second sense amplifiers, a plurality of N-channel MOS second transistors, and a plurality of equalizing means. Each of the plurality of memory cells comprises N-channel MOS first transistor and a capacitor, and the first potential or the ground potential is held to the capacitor, and the memory cells are arranged in plural rows and plural columns. The plurality of word lines are installed corresponding to each row of the memory cells, and used to select the memory cell of each row. The plurality of bit line pairs are installed corresponding to every two columns of the memory cell, and the bit lines included in each column are connected to the first transistor of the corresponding memory cells. The plurality of first sense amplifiers are connected to each of the bit line pairs, and generate the power source potential. The plurality of second sense amplifiers are connected to each of the bit line pairs, and amplifies one potential of the bit lines included in the connected bit line pair into the ground potential. Each of the plurality of N-channel MOS second transistors is connected between each of the first sense amplifiers and each of the bit lines included in each of the bit line pairs, and drops the power source voltage generated in the first sense amplifiers into the first potential by the threshold voltage, and amplifies other potential of the bit lines included in the connected bit line pairs into the first potential. The plurality of equalizing means are installed corresponding to each of the bit line pairs, and equalizes the first potential produced on each of the bit lines to included in the corresponding bit line pair the ground potential into intermediate potential between these potentials.

The semiconductor memory device in above-mentioned constitution is provided with the potential control means (plurality of N-channel MOS second transistors) and the bit line precharge potential is moved to "L" level side, thereby unbalance between each read-out potential difference of "H" level and "L" level of the information signal is decreased and the read-out margin is increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
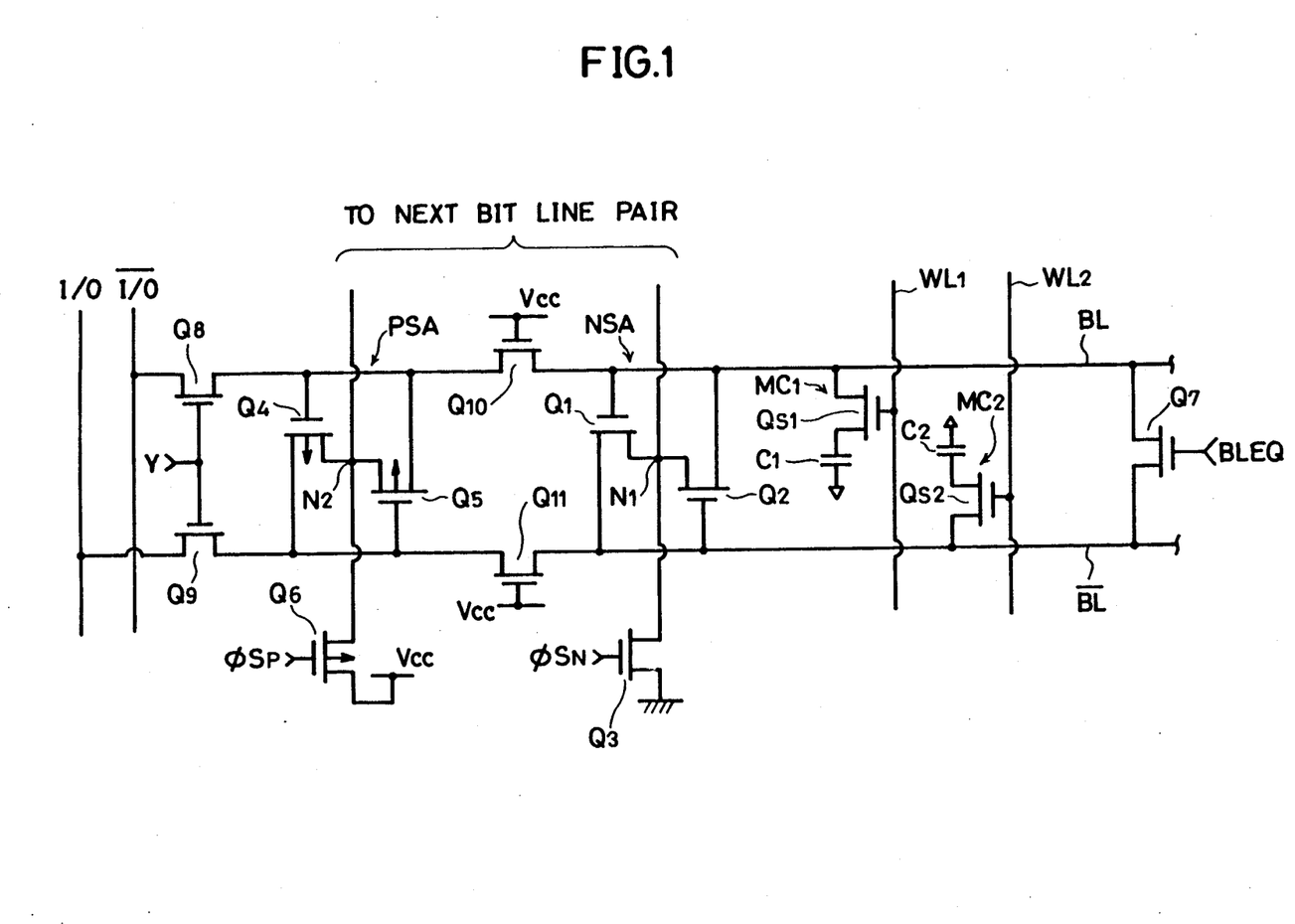
FIG. 1 is a circuit constitution diagram around a pair of bit lines according to an embodiment of the invention.

FIG. 1 is a diagram illustrating portion of a bit line pair of a dynamic semiconductor memory device according to an embodiment of the invention, and corresponds to FIG. 4 in the prior art.

The difference in constitution from FIG. 4 is that N-channel MOS transistors Q10 and Q11 are connected to the portion of bit lines BL, $\overline{BL}$ where N type sense amplifier NSA and P type sense amplifier PSA and the like are connected. The power source potential Vcc is supplied to gate of the transistors Q10 and Q11, and these transistors are normally turned on. FIG. 1 is similar to FIG. 4 in make-up except for the above difference, and the description of the FIG. 4 arrangement shall be omitted here. Also basic operation of the circuit is similar to that shown in the prior art of FIG. 4, and the description shall be omitted here.

Figure 2:
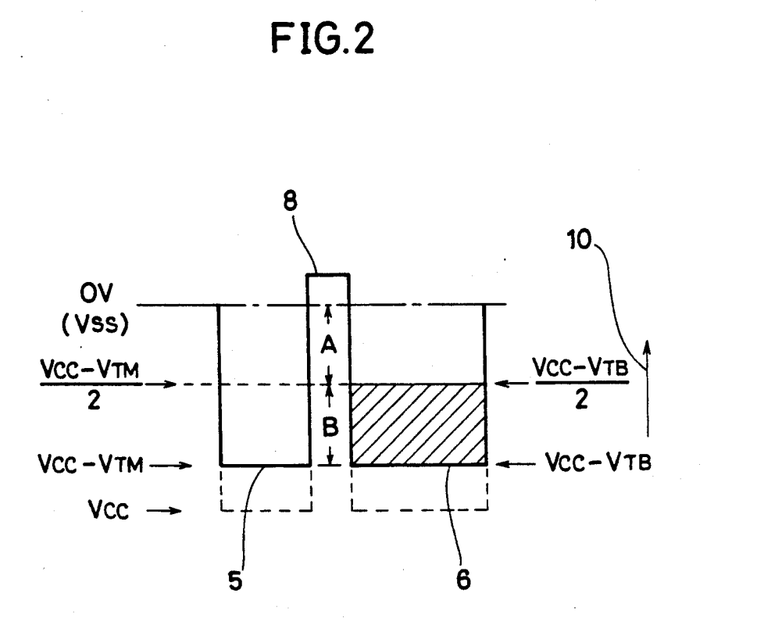
FIG. 2 is a diagram illustrating state of potential around a memory cell in FIG. 1.

FIG. 2 is a diagram illustrating potential around a memory cell in FIG. 1.

Characteristics in operation of the embodiment according to installation of the transistors Q10 and Q11 will now be described referring to FIGS. 1 and 2.

The transistors Q10 and Q11 have threshold voltage $V_{TB}$.

To simplify the description, assume that information of "H" level, i.e., potential of $Vcc - V_{TM}$ is held in a memory cell MC1, and operation of reading-out this information will be described.

Before a word line WL1 is selected, the sense amplifiers PSA and NSA are activated, and the bit line BL on the side of the same sense amplifier PSA is at Vcc level and the corresponding bit line $\overline{BL}$ is at Vss level (0V). The bit line BL on the same side of transistor Q10 as the memory cell MC1 has potential $Vcc - V_{TB}$ in accordance with characteristics of the transistor Q10 as shown in FIG. 2. Sense amplifier activating signal $\phi S_P$ goes to the "H" level and sense amplifier activating signal $\phi S_N$ goes to the "L" level, and the then equalizing signal BLEQ becomes "H" level and respective potential of the bit lines BL, $\overline{BL}$ is equalized to the an intermediate potential. More specifically, the intermediate potential becomes $(Vcc - V_{TB})/2$. After the equalizing signal BLEQ is returned from "H" level to "L" "0 level, the word line WL1 is selected to the "H" level and transistor Qs1 is turned on. Potential $(Vcc - V_{TM})$ held in the capacitor C1 is read out at the bit line BL.

Since the bit lines BL, $\overline{BL}$ are already precharged to $(Vcc - V_{TB})/2$ before the reading-out, if the threshold voltage $V_{TM}$ of the transistor Qs1 and the threshold voltage $V_{TB}$ of the transistor Q10 are made identical (about 1V), the intermediate potential $(Vcc - V_{TM})/2$ of the holding potential (0 or $Vcc - V_{TM}$) of the memory cell and the precharge potential $(Vcc - V_{TB})/2$ of the bit lines BL, $\overline{BL}$ become equal. That is, the read-out voltages A, B with respect to the precharge potential of information become equal, and the potential $(Vcc - V_{TB})$ of the bit line BL can be used effectively. Numerically, the read-out voltage B according to the embodiment in comparison to the read-out voltage B in FIG. 8 of the prior art is increased by $$\underbrace{\left(Vcc - V_{TM} - \frac{Vcc - V_{TB}}{2}\right)}_{\text{embodiment}} - \quad (1)$$

$$\underbrace{\left(Vcc - V_{TM} - \frac{1}{2} Vcc\right)}_{\text{prior art}} = \frac{1}{2} V_{TB}$$

thereby the reading-out margin is increased.

In the embodiment, although the threshold voltage is made equal between the transistors Qs1 and Qs2 and between the transistors Q10 and Q11, it need not be necessarily made equal. As a result of formula (1), the transistors Q10 and Q11 can be installed so that the reading-out margin is always increased by $V_{TB}/2$.

Figure 3:
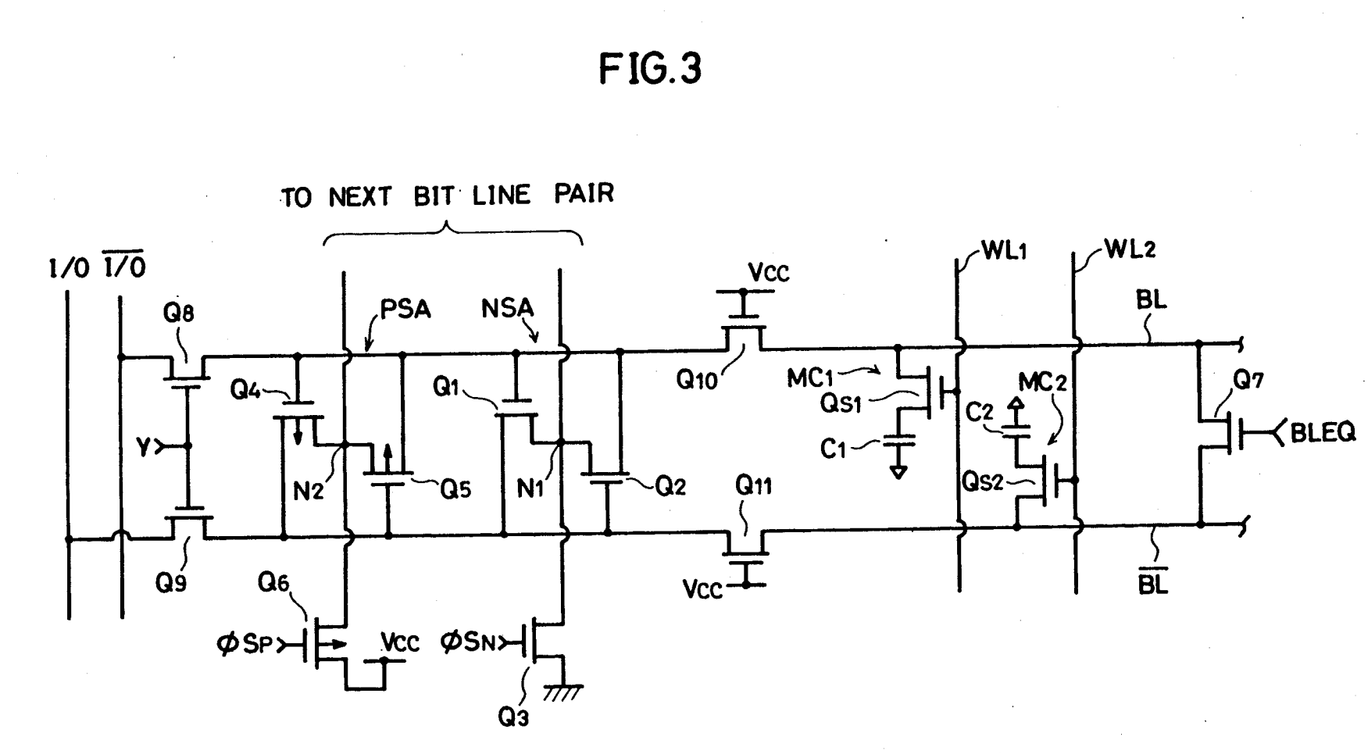
FIG. 3 is a circuit diagram illustrating a pair of bit lines according to another embodiment of the invention.

Also in the embodiment, although the transistors Q10 and Q11 are installed between the sense amplifier PSA and the sense amplifier NSA, the transistors Q10 and Q11 may be installed between the sense amplifier NSA and the portion of the lines BL, $\overline{BL}$ to which the memory cells MC1 and MC2 are connected. Thereby a similar effect can be obtained. FIG. 3 is a diagram illustrating a portion of a bit line pair of a dynamic semiconductor memory device according to another embodiment of the invention, illustrating the structure described above.

In the invention as above described, since the potential control means are installed and the precharge potential of the bit line potential is moved to "L" level side, unbalance of each read-out voltage difference at "H" level and "L" level of information is decreased and the reading-out margin is increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a bit line pair composed of a first portion and a second portion;
a plurality of memory cells connected to each bit line of the bit line pair of said first portion;
first potential generating means connected to each of the bit lines of the bit line pair of said second portion for generating a first potential in response to potential of each of the bit lines of the bit line pair of said second portion and for supplying a first bit line of the bit line pair of said second portion with said first potential;
second potential generating means connected to each of the bit lines of the bit line pair of said first portion for generating a second potential less than the first potential in response to potential of each of the bit lines of the bit line pair of said first portion and for supplying a second bit line of the bit line pair of said first portion with said second potential; and
potential control means connected in series on each of the bit lines of the bit line pair between said first portion and said second portion of said bit line pair for dropping and transmitting the said first potential supplied to said first bit line of the bit line pair of said second portion onto said first bit line of the bit line pair of said first portion, said dropped and transmitted potential being larger than said second potential.

2. A semiconductor memory device as set forth in claim 1, wherein said first potential generating means is a P-type sense amplifier, said second potential generating means is an N-type sense amplifier, said potential control means is an N-channel MOS transistor having a threshold voltage, and said first potential is attenuated to a third potential equal in value to a difference between said threshold voltage and said first potential.

3. A semiconductor memory device as set forth in claim 2, wherein each of said memory cells holds one of said second potential and said third potential.

4. A semiconductor memory device comprising:
   at least a pair of bit lines;
   at least two memory cells connected to said bit lines for holding one of a first potential and a second potential having a value less than said first potential;
   selective means for selecting any of said memory cells; and
   reading-out means for reading out one of said first potential and said second potential held in a selected memory cell onto a bit line connected to the selected memory cell in response to an output of said selective means;
   wherein potential of said bit line is varied based on a potential read out by the reading-out means,
   said memory device further comprising:
   second potential generating means connected to each of the bit lines for generating said second potential in response to variation of the potential of the connected bit line;
   third potential generating means connected to each of the bit lines for generating a third potential larger than said first potential in response to variation of the potential of the connected bit line;
   potential control means connected between said third potential generating means and each of the bit lines for supplying one of the bit lines with said third potential by said third potential generating means as fourth potential less than said third potential and larger than said first potential;
   connecting means connected between said second potential generating means and each of the bit lines for supplying other of the bit lines with said second potential by said second potential generating means; and
   equalizing means for equalizing potential of each of the bit lines generated by said potential control means and said connecting means into an intermediate potential between said third and said second potentials,
   wherein said selective means is activated so that each of the bit lines is held to the intermediate potential by said equalizing means.

5. A semiconductor memory device as set forth in claim 4, wherein said reading-out means includes a first N-channel MOS transistor, having a first threshold voltage, wherein a sum of said threshold voltage of said first transistor and said first potential is equal to said third potential.

6. A semiconductor memory device as set forth in claim 5, wherein said potential control means includes a second N-channel MOS transistor, having a threshold voltage, wherein the difference between said threshold voltage of said second transistor and said third potential is equal to said fourth potential.

7. A semiconductor memory device as set forth in claim 6, wherein the threshold voltage of said first transistor is equal to the threshold voltage of said second transistor.

8. A semiconductor memory device as set forth in claim 4, wherein said third potential generating means generates said third potential in response to a rise in potential on the bit lines caused by the presence of the first potential read out by the reading-out means.

9. A semiconductor memory device as set forth in claim 8, wherein said second potential generating means generates said second potential in response to a drop in potential on the bit lines caused by the presence of the second potential read out by said reading-out means.

10. A semiconductor memory device as set forth in claim 4, wherein said third potential generating means is a sense amplifier including a plurality of P-channel MOS transistors.

11. A semiconductor memory device as set forth in claim 4, wherein the second potential generating means is a sense amplifier including a plurality of N-channel MOS transistors.

12. A semiconductor memory device comprising:
   a plurality of memory cells each comprising N-channel MOS first transistor and a capacitor, said capacitor holding one of first potential and ground potential, said memory cells being arranged in plural rows and plural columns;
   a plurality of word lines installed corresponding to each row of the memory cells and used to select the memory cells of each row;
   a plurality of bit line pairs installed corresponding to every of said bit line pairs of the memory cells, the bit lines included in each column being connected to a first transistor each of the corresponding memory cells;
   a plurality of first sense amplifiers connected to each of said bit line pairs for generating a potential equal to a power source potential;
   a plurality of second sense amplifiers connected to each of said bit line pairs for amplifying the potential of one of the bit lines included in the connected bit line pair into the ground potential;
   a plurality of N-channel MOS second transistors each connected between each of said first sense amplifiers and each of the bit lines included in each of said bit line pairs for dropping the power source potential generated in said first sense amplifiers by the threshold voltage into said first potential and for amplifying the potential of the other of the bit lines included in the connected bit line pair to attain said first potential; and
   a plurality of equalizing means installed corresponding to each of said bit line pairs for equalizing said first potential generated to each of the bit lines included in the corresponding bit line pair and said ground potential into intermediate potential between them.

13. A semiconductor memory device as set forth in claim 12, wherein the threshold voltage of said first transistor is equal to the threshold voltage of said second transistor, and said power source potential is supplied to gate of said first transistor.

14. A method of improving read-out voltage in a semiconductor memory device including a plurality of memory cells each comprising N-channel MOS first transistor and a capacitor, said capacitor holding one of first potential and ground potential, said memory cells being arranged in plural rows and plural columns; a plurality of word lines installed corresponding to each row of the memory cells and used to select the memory cells of each row; a plurality of bit line pairs installed corresponding to every of said bit line pairs of the memory cells, the bit lines included in each column being connected to a first transistor each of the corresponding memory cells; a plurality of first sense amplifiers connected to each of said bit line pairs for generating a potential equal to a power source potential; a plurality of second sense amplifiers connected to each of said bit line pairs for amplifying the potential of one of the bit lines included in the connected bit line pair into the ground potential; and a plurality of equalizing means installed corresponding to each of said bit line pairs for equalizing said first potential generated to each of the bit lines included in the corresponding bit line pair and said ground potential into intermediate potential between them, comprising the steps of:

reducing the potential generated by said first sense amplifier to attain the first potential by a transistor threshold potential; and amplifying the other potential of the bit lines included in the connected bit line pair to attain said first potential.

15. A semiconductor memory device comprising:

a bit line pair composed of a first portion and a second portion;

a plurality of memory cells connected to each bit line of the bit line pair of said first portion;

first potential generating means connected to each of the bit lines of the bit line pair of said second portion for generating a first potential in response to potential on the bit lines of the bit line pair of said second portion and for supplying a first bit line of the bit line pair of said second portion with said first potential;

second potential generating means connected to each of bit lines of the bit line pair of said second portion for generating second potential less than the first potential in response to potential on the bit lines of the bit line pair of said second portion and for supplying a second bit line of the bit line pair of said second portion with the second potential; and potential control means connected in series on each of the bit lines of the bit line pair between said first portion and said second portion of said bit line pair for attenuating and transferring said first potential supplied to said first bit line of the bit line pair of said second portion onto one bit line of the bit line pair of said first portion, said attenuated and transferred potential being larger than said second potential.

16. A semiconductor memory device as set forth in claim 1, wherein said first potential generating means is a P-type sense amplifier, said second potential generating means is an N-type sense amplifier, said potential control means is an N-channel MOS transistor having a threshold voltage, and said first potential is attenuated to a third potential equal in value to a difference between said threshold voltage and said first potential.

17. A semiconductor memory device as set forth in claim 2, wherein each of said memory cells holds one of said second potential and said third potential.

* * * * *